United States Patent [19]

Bean

[11] 3,879,606

[45] Apr. 22, 1975

[54] LIGHT PROJECTION COUPLING OF SEMICONDUCTOR TYPE DEVICES THROUGH THE USE OF THERMALLY GROWN OR DEPOSITED $SIO_2$ FILMS

[75] Inventor: Kenneth E. Bean, Richardson, Tex.

[73] Assignee: Texas Instruments Incorporated, Dallas, Tex.

[22] Filed: Sept. 24, 1973

[21] Appl. No.: 400,073

[52] U.S. Cl. .................. 250/227; 350/96 R; 357/30
[51] Int. Cl. .......................... G02b 5/14; H01l 15/00
[58] Field of Search ........ 250/227, 552; 317/235 N; 350/96 R; 357/30

[56] References Cited

UNITED STATES PATENTS

| | | | |
|---|---|---|---|
| 3,636,358 | 1/1972 | Groschwitz | 317/235 N |
| 3,708,672 | 1/1973 | Marinkovec | 250/552 |
| 3,748,479 | 7/1973 | Lehovec | 317/235 N |

*Primary Examiner*—James W. Lawrence
*Assistant Examiner*—T. N. Grigsby
*Attorney, Agent, or Firm*—Harold Levine; James T. Comfort; Gary C. Honeycutt

[57] ABSTRACT

The disclosure relates to a method and system for coupling semiconductor components on a single semiconductor chip or wafer without providing the possibility for short circuits and/or capacitances between metallization layers where connections between one set of components via metallization must pass across the path of connections via metallization to other sets of components. This is accomplished by providing a light conducting path in the semiconductor chip or wafer, such as in the form of a silicon dioxide layer path between the elements to be coupled. A device is provided in the coupling path which is capable of passing a light beam to the elements themselves for activating them, the elements being activated by light impinging on them. The elements are light responsive for actuation, or actuated electrically by another adjacently located light responsive element. The device for providing the light can be a light emitting diode which is externally controlled, a set of mirrors which reflect light from an external laser beam or any other system capable of providing light. The light travels through the silicon dioxide layer which has the properties of a light pipe and will actuate all light responsive semiconductor devices in the crystal to which the path of silicon dioxide is connected. There is no short circuit or stray capacitance problem due to elimination of at least part of the metallization.

7 Claims, 4 Drawing Figures

LIGHT PROJECTION COUPLING OF SEMICONDUCTOR TYPE DEVICES THROUGH THE USE OF THERMALLY GROWN OR DEPOSITED $SIO_2$ FILMS

This invention relates to a method of coupling semiconductor devices along paths which travel over the metallization paths connecting other semiconductor devices on the same chip without providing short circuits and/or stray capacitances and, more specifically, to a method and system for coupling semiconductor devices on the same chip which are light responsive by providing a light conducting path in the form of silicon dioxide layer between the devices to be coupled.

It is well known in the semiconductor art that, in the case of integrated circuits having a plurality of semiconductor devices on the chip, it is often necessary to interconnect semiconductor devices by means of metallization or the like wherein the interconnecting paths of different sets of devices will cross, being separated only by a thin insulative layer. Often there can be a breakdown in the thin insulative layer. This can provide short circuits in the semiconductor device. One method of overcoming those problems has been to provide several layers of metallization whereby the metallization layers pass over one another but on different levels. Furthermore, the existence of metal layers separated by an insulative layer provides a capacitor and gives rise to stray capacitances which can impede proper circuit operation. In addition, often there are short circuits provided through the insulating layer separating different levels of metallization.

Briefly, in accordance with the present invention, there is provided a method and circuit for overcoming the above noted problem and permitting the interconnection of devices on a single semiconductor chip without any possibility of causing short circuits and/or stray capacitances of undesirable nature. Briefly, in accordance with the invention, there is provided a semiconductor substrate having a plurality of semiconductor devices therein. Several of these devices are interconnected by standard metallization techniques. Other of the devices which would be interconnected by paths which may cross the metallization connecting other devices, are interconnected, rather than by metallization, by light conducting paths formed on the semiconductor device in the form of a silicon dioxide layer. The semiconductor devices to be interconnected in this manner are light responsive and are therefore made operational by the impingement of light thereon through the light conducting silicon dioxide layer. Light is placed by any of several known means. For example, light emitting diodes (LED's) can be formed on a semiconductor device either as a separate component on the surface thereof or in the chip itself by well known means, the light emitting diode being externally controlled to place light into the silicon dioxide layer through which it travels to the light actuated devices. A further method of providing light in the silicon dioxide layer would be directly from a laser beam or to provide a set of mirrors in the silicon dioxide path and impinge light on the mirrors by means of an external laser or the like, the light being reflected off of the mirrors and along the silicon dioxide path or other operational light conducting layer to activate the light responsive semiconductor components along the path.

It is therefore an object of this invention to provide a means of coupling semiconductor devices on a single semiconductor chip by means of light projection.

It is a further object of this invention to provide coupling of semiconductor components on a single semiconductor chip by passing light along silicon dioxide layers formed on the semiconductor chip.

It is a still further object of this invention to provide a semiconductor circuit wherein plural semiconductor devices are made operative or inoperative by an external light source whose light passes along a layer on the semiconductor substrate.

It is a yet further object of this invention to provide an interconnect system on a single semiconductor chip incapable of providing short circuits and/or stray capacitances.

The above objects and still further objects of the invention will immediately become apparent to those skilled in the art after consideration of the following preferred embodiments thereof, which are provided by way of example and not by way of limitation, wherein.

Figure 1:
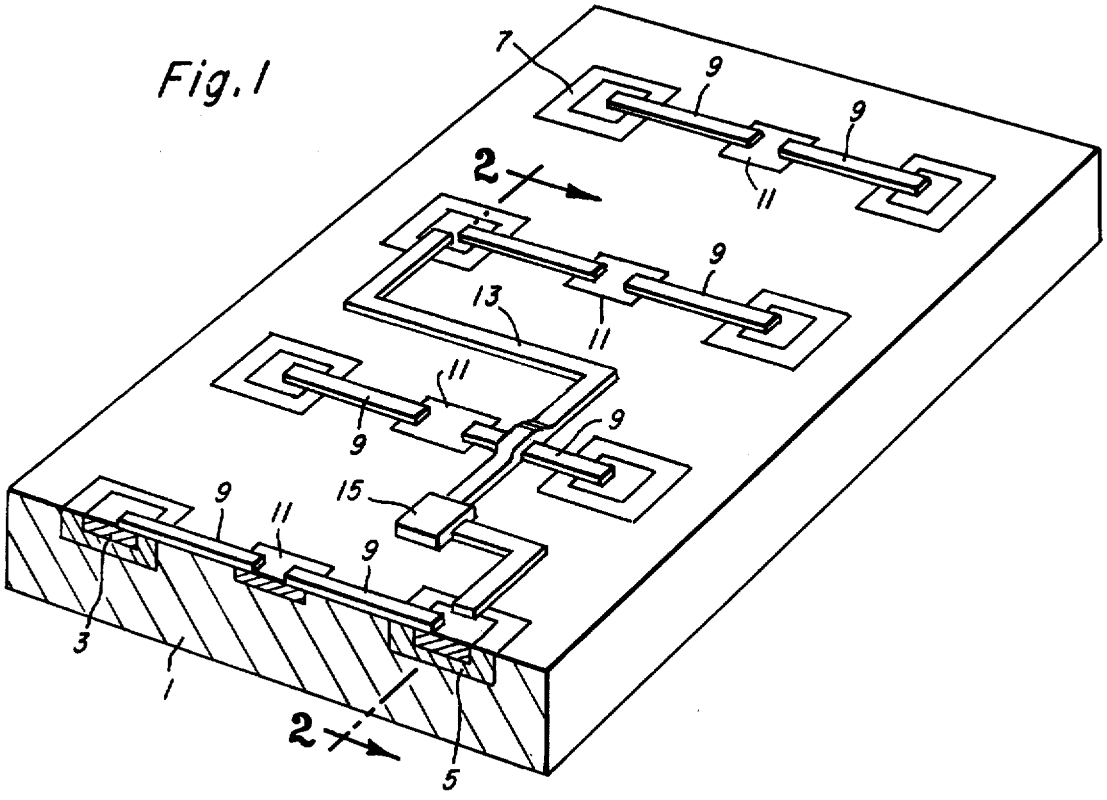
FIG. 1 is a schematic embodiment of a semiconductor circuit in accordance with the present invention.

Referring now to FIG. 1, there is shown a semiconductor device 1 having a plurality of transistors 3, 5, 7, . . . thereon. Certain ones of the semiconductor devices are interconnected by means of metallization 9 through resistors 11. It can be seen that if transistors 5 and 7 are to be interconnected, a metallization path would have to pass over the metallization 9 and thereby form a short circuit therewith. The prior art has overcome this problem to some extent by providing layers of metallization, one atop the other, with an insulating layer between the layer of metallization 9 and the layer of metallization which would interconect transistors 5 and 7, wherein the interconnecting metallization between transistors 5 and 7 would normally not cause a short circuit with the metallization 9. However, the passage of metallization layers, one atop the other, causes stray capacitances which can be very undesirable and occasionally void or other faults in the insulation layer can still cause short circuits. In order to overcome this problem inherent in overlapping layers of metallization as discussed above, the transistors 5 and 7 are provided to be light responsive. That means, with the impingement of light thereon, these transistors will become conductive. The transistors 5 and 7 are interconnected by means of a silicon dioxide layer 13 which can be deposited or thermally grown and which can pass over or beneath the metallization 9, the silicon dioxide being capable of transmitting light therethrough in the same manner as the well known Lucite light conducting rods. The light is placed in the silicon dioxide layer 13 by means of light emitting diode (LED) 15 which is externally controlled and provides the light for controlling the transistors 5 and 7. The light emitting diode 15 can be formed in the chip 1 or can be formed on the surface of the chip 1, both being provided by well known methods of forming such diodes in or on a chip. The light conducting layer 13 is preferably silicon oxide but can be any material capable of conducting light and compatible with the remaining components of the chip.

Figure 2:
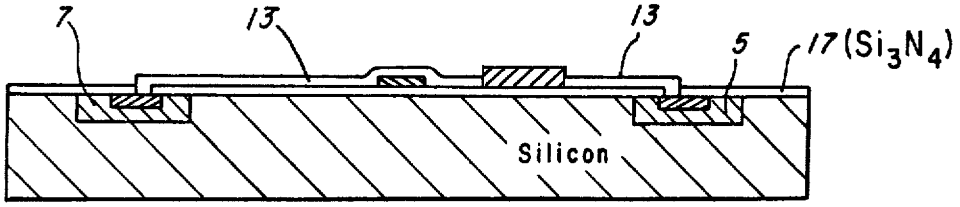
FIG. 2 is a section taken along the lines 2—2 of FIG. 1.

Referring now to FIG. 2, there is shown a cross section taken along the line 2—2 of FIG. 1 which better exemplifies the light coupling circuitry of FIG. 1. There is shown the silicon substrate 1 and semiconductor devices 5 and 7. A silicon nitride mask 17 is provided on the semiconductor surface with a window therein over the control electrode of the transistors 5 and 7 to allow light passing in a light conducting silicon dioxide layer 13 to impinge upon the control electrodes of the transistors 5 and 7. A light emitting diode 15 is formed on a surface of the semiconductor wafer 1 in well known manner, the LED providing the light under proper external control in well known manner which passes along the silicon dioxide layer 13 and over the metallization layer 9 to control the transistors 5 and 7.

Figure 3:
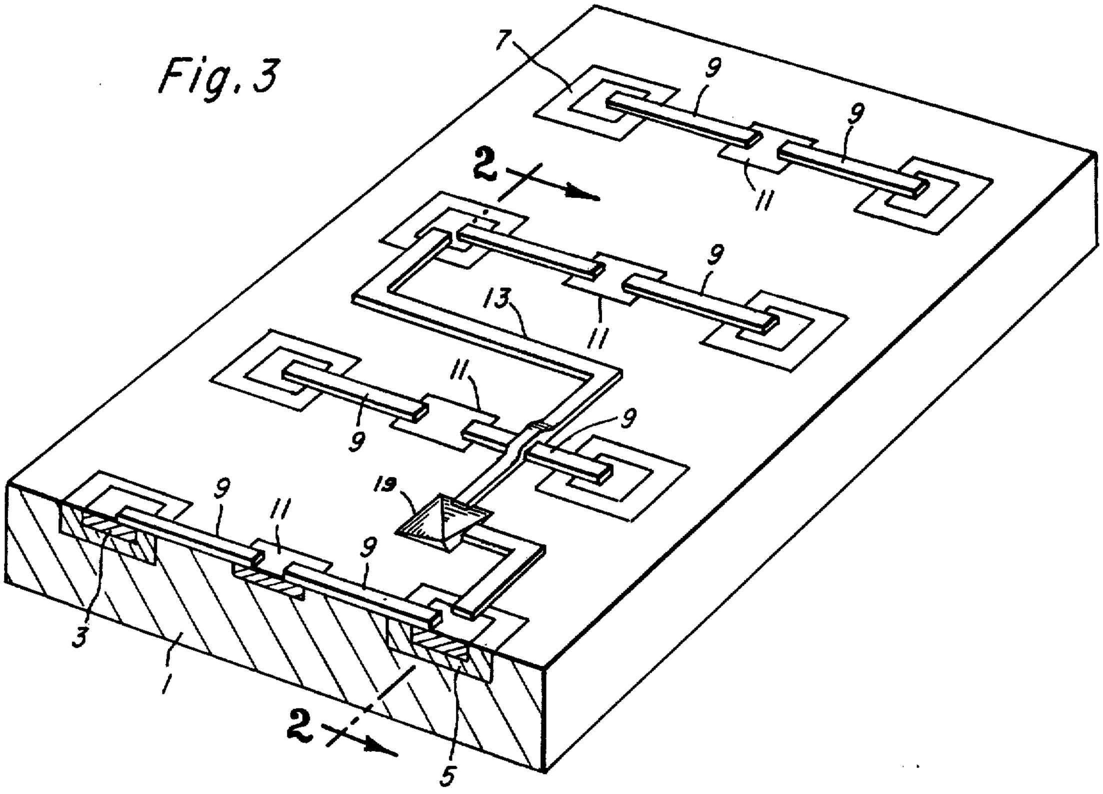
FIG. 3 is a schematic view of a second embodiment of the invention.
Figure 4:
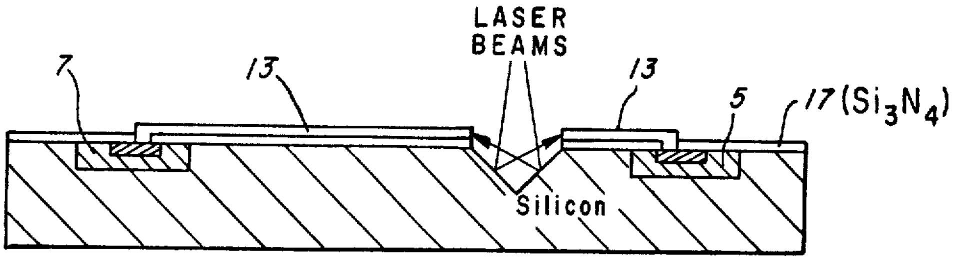
FIG. 4 is a sectional view along the lines 2—2 of FIG. 3.

In accordance with the second embodiment of the invention, as illustrated by FIGS. 3 and 4, LED 15 is replaced by a set of mirrors, each mirror directed to reflect light along the silicon dioxide layer 13 toward one of the transistor 5 and the transistor 7. Light impinges upon the mirrors by means of an external light source which can be remote from the chip if desired. Such an external light source can be a remote laser beam which causes light to impinge upon the mirrors and be reflected therefrom along the silicon dioxide layers 13 to control the transistors 5 and 7. These mirrors can be normal silvered mirrors or can be formed by providing a V-shaped groove in the substrate by orientation dependent etching (ODE). For example, if an ODE etch is provided with mask alignment parallel to a (111) trace at the (100) surface, the V-groove will have an angle of 54.7° with respect to the surface with mask alignment parallel to a (331) trace at the (100) surface, V-groove 19 (FIG. 3) will have an angle of about 46° relative to the surface. Etches along other planes can also be used. ODE etching provides crystallographically sharp surfaces in the V-groove and therefore can act as a mirror itself or could have a reflective surface placed thereon. It should be understood that other crystallographically oriented substrates can be used with ODE etching along appropriate directions to provide the above result. The (100) substrate is preferred.

It is apparent that there has been shown a relatively simple and inexpensive device for providing interconnection of semiconductor devices on a single semicondutor chip wherein interconnection paths must pass over one another without providing any possibility of short circuits or undesirable stray capacitances.

Though the invention has been described with respect to specific preferred embodiments thereof, many variations and modifications thereof will immediately become apparent to those skilled in the art. It is therefore the intention that the appended claims be interpreted as broadly as possible in view of the prior arts to include all such variations and modifications.

What is claimed is:

1. A semiconductor chip interconnect system, which comprises in combination:

a. a semiconductor chip, b. a pair of light responsive semiconductor devices formed in said chip, c. a layer of light conducting material overlying at least a portion of one surface of said chip and having termination points at said semiconductor devices for transmitting light thereto, d. a mirror mounted on said chip communicating with said layer of light conducting material, and e. means to direct light onto said mirror.

2. A system as set forth in claim 1 wherein said means to direct light is a laser.

3. A system as set forth in claim 1 wherein said light conducting material is a silicon oxide.

4. A system as set forth in claim 3 wherein said means to direct light is a laser.

5. A system as set forth in claim 3 wherein said reflecting means is a crystallographic plane in said silicon chip.

6. A semiconductor chip interconnect system which comprises in combination:

a. a semiconductor chip, b. a pair of light responsive semiconductor devices formed in said chip, c. a layer of light conducting material overlying at least a portion of one surface of said chip and having termination points at said semiconductor devices for transmitting light thereto, d. a reflecting means communicating with said layer of light conducting material, and e. laser means to direct light onto said reflecting means.

7. A system as set forth in claim 6 wherein said light conducting material is a silicon oxide.

* * * * *